United States Patent [19]

Maudsley et al.

[11] Patent Number: 4,585,992
[45] Date of Patent: Apr. 29, 1986

[54] NMR IMAGING METHODS

[75] Inventors: Andrew A. Maudsley, Woburn, Mass.; Sadek K. Hilal, New York, N.Y.; Howard E. Simon, Monroe, Conn.

[73] Assignee: Philips Medical Systems, Inc., Shelton, Conn.

[21] Appl. No.: 576,851

[22] Filed: Feb. 3, 1984
(Under 37 CFR 1.47)

[51] Int. Cl.$^4$ .............................................. G01R 33/20
[52] U.S. Cl. ..................... 324/309; 324/312; 324/320
[58] Field of Search ............... 320/300, 307, 309, 312, 320/314, 320

[56] References Cited

U.S. PATENT DOCUMENTS

| | | | |
|---|---|---|---|
| 4,173,775 | 11/1979 | Kneip | 324/320 |
| 4,254,778 | 3/1981 | Clow | 324/314 |
| 4,284,948 | 8/1981 | Young | 324/309 |
| 4,284,950 | 8/1981 | Burl | 324/320 |
| 4,300,096 | 11/1981 | Harrison | 324/309 |
| 4,307,343 | 12/1981 | Likes | 324/307 |
| 4,307,344 | 12/1981 | Walters | 324/307 |
| 4,315,216 | 2/1982 | Clow | 324/309 |
| 4,319,190 | 3/1982 | Brown | 324/309 |
| 4,339,716 | 7/1982 | Young | 324/309 |
| 4,340,862 | 7/1982 | Percival | 324/309 |
| 4,354,499 | 10/1982 | Damadian | 324/309 |
| 4,355,282 | 10/1982 | Young | 324/309 |
| 4,361,807 | 11/1982 | Burl | 324/309 |
| 4,379,262 | 4/1983 | Young | 324/309 |
| 4,384,255 | 5/1983 | Young | 324/309 |
| 4,389,613 | 6/1983 | Brown | 324/312 |
| 4,390,840 | 6/1983 | Gaassen | 324/309 |
| 4,411,270 | 10/1983 | Damadian | 324/309 |
| 4,417,209 | 11/1983 | Hounsfield | 324/309 |
| 4,418,316 | 11/1983 | Young | 324/309 |
| 4,422,042 | 12/1983 | Sugimoto | 324/319 |
| 4,424,488 | 1/1984 | Hounsfield | 324/309 |
| 4,523,166 | 6/1985 | Gross | 324/320 |

Primary Examiner—Michael J. Tokar
Attorney, Agent, or Firm—Jack E. Haken

[57] ABSTRACT

Measurement of magnetic field distributions is performed using a method based on the nuclear magnetic resonance (NMR) technique of Fourier imaging. By selecting objects which limit the spatial distribution of the NMR observable nuclei, images can be obtained which allow easy interpretation of the magnetic field distribution and facilitate rapid shimming of magnets. A method for providing a convenient display of field data is provided, as well as chemical shift imaging with correction for static field inhomogeneity. Results from these field plots are used as corrections for static field inhomogeniety when obtaining a chemical shift image. A method for localized spectral analysis from the chemical shift image is also provided.

18 Claims, 8 Drawing Figures

NMR IMAGING METHODS

This invention relates to NMR imaging, and more in particular to improvements in methods enabling the more rapid and accurate development of images, especially adapted for in vivo imaging. The invention results from the identification of a need i.e., the ability to perform NMR spectroscopy in-vivo and thereby take advantage of results of much biomedical NMR research utilizing in-vitro samples in the past.

BACKGROUND OF THE INVENTION

NMR spectroscopy, the process of analyzing a small sample in a uniform magnetic field and obtaining radiofrequency data resulting from precisely pulsed radiofrequency excitation, was invented by Block and Purcell. In the last 15 years, NMR analysis by spectroscopy has shifted from physical chemistry to biological chemistry and biomedical applications; i.e. biopsy samples of normal and diseased tissues.

Separately Lauterbur and Damadian invented the utilization of NMR principles to produce an image. The resulting devices, NMR imaging systems, produce two-dimensional and three-dimensional data where the grey scale represent, the three parameters nuclide density, and $T_1$ $T_2$ relaxation parameters spatially in an anatomical image.

The measurement of magnetic field distributions is a requirement of many experimental applications. It is particularly important in the area of nuclear magnetic resonance (NMR) imaging, where an increasing number of clinical applications are being studied and NMR imaging systems are being developed commercially. In these systems the image quality is greatly dependent upon the strength and homogeneity of the magnetic fields used, influencing the sensitivity of the data collection and the accuracy of the spatial measurement. A necessary requirement for the successful installation of each new imaging system is the rapid setting or shimming of the magnet. The observation of the field distributions during the shimming procedure is frequently done by a point by point measurement of the field using a NMR probe. This method is, however, a relatively inefficient procedure, and there exists an experimental method which is based on the principles of Fourier imaging (A. Kumar, D. Welti and R. R. Ernst, 1975 "NMR Fourier zeugmatography" J. Magn. Reson. 18, 69–83 and A. A. Maudsley, A. Oppelt and A. Ganssen, 1979 "Rapid measurement of magnetic field distributions using nuclear magnetic resonance" Siemens Forsch u. Entwickl. Ber. 8, 326–31) that provides a faster, more accurate, and more convenient means of measuring the magnetic field homogeneity in two or three dimensions.

In-vitro sample NMR magnets for NMR must have 0.1 ppm homogeneity or better in the sample area to provide a useful resolved spectrum. A whole body in-vivo NMR magnet at today's state of the manufacturing art over a head or body organ size volume is at best 5.0 to 10.0 ppm. Since peaks are separated by 2 to 5 ppm at levels of medical significance, 5 to 10 ppm is insufficient for meaningful NMR spectroscopy.

In the use of NMR spectroscopy, a clinician must acquire spectra from a desired location within a patient's organ without intervention (biopsy); i.e. compare normal tissue with suspected disease tissue. Spectra can be obtained from the total image volume or area or line of NMR image data but this has not been sufficient to localize the information. The use of a small surface coil placed on the surface of the body has been suggested to obtain spectra. However, this does not provide sufficient localization, either in acquired spectral data due to interlying tissue between the coil and the desired point of sensitivity, or in any guide to anatomical location as to where to place the coil to obtain spectra from a desired location.

For effective diagnosis, it is necessary to provide visual communication of spectral information to the image-oriented diagnostician. A display of a spectrum per pixel or voxel, however, in accordance with prior practice, would be both confusing to an image-oriented diagnostician as well as presenting too much data to be meaningfully absorb for diagnostic purposes.

BRIEF SUMMARY OF THE INVENTION

Briefly stated, in accordance with one embodiment of the invention, the problem of inhomogeneity is solved by employing a "phantom" or a major peak as a reference and shifting spectra regionally in the data set to correct for inhomogeneity frequency shift. A phantom, as the term is herein employed, is a sample of known configuration and content.

As a further feature, in order to enable association of spectra with the location of the imaging volume, in accordance with the invention a pulse sequency is employed which acquires both spatial NMR data and spectra per pixel or voxel associated with the NMR image data.

In accordance with a further feature of the invention, effective visual communication of spectral information to an image-oriented diagnostician is enabled by providing:

a. A multiformat display, CRT, or film which presents many images simultaneously each from a sequentially higher or lower frequency point on the inhomogeneity-corrected spectra.

b. A "cine" display of images on a CRT which presents a time series of images, each from a sequentially higher or lower frequency point on the inhomogeneity-corrected spectra.

c. A multiformat CRT or film display of images added together from various peaks selected and all images added together. This allows selected reduction of image data to desired spectral peak frequencies and improves the signal-to-noise ratio by adding frames of images together.

d. A display of one or more spectra from regions of interest selected on the spectrally differentiated image seen on the display CRT. A true association of spectra from a desired region within an in-vivo organ.

In accordance with a still further feature of the invention, nuclear magnetic resonance imaging techniques are provided for the observation of spatially resolved phosphorous (or other) spectra in vivo to observe various changes. Two-dimensional images of separate phosphorus-containing compounds as well as the full NMR spectra arising from spatially localized points may be obtained for monitoring metabolism within tissue in a completely non-invasive manner.

The present invention thereby provides nuclear magnetic resonsance imaging softward for acquisition, processing, and display which:

1. Acquires NMR spectra per pixel or voxel of an NMR image.

2. Provides an NMR pulse sequence which acquires both spectra and positional information for an image series which communicates spectral distribution per pixel or voxel.

3. Provides an image set from a patient, animal, or phantom which, when seen, communicates to the viewer NMR spectral data by assigning a two-dimensional image to multiple points of an NMR spectrum.

4. Presents a multi-format image of a patient, animal, or phantom. Here each image represents x.x parts per million of an NMR spectrum and the spectral quantity per pixel or voxel is displayed as a grey level positioned to form images.

5. Produces an inhomogeneity correction for acquired images of a patient, animal, or phantom so that an NMR imaging magnet can perform accurate spectroscopically differentiated images.

6. Performs an inhomogeneity correction by acquiring an NMR image of a homogeneous phantom filled with traces of an appropriate nuclide, which provides spatial information of inhomogeneity as a spatial set of spin frequencies. Since in an ideal homogeneous field, all frequencies in the spatial set would be indentical, the amount of frequency shift from the ideal single frequency quantifies inhomogeneity. The frequency shift per pixel or voxel is utilized to shift NMR spectral data acquired from a paient, animal, or phantom in the reverse amount per pixel or voxel, thereby performing a correction for inhomogeneities of the magnetic field.

7. Performs inhomogeneity correction on acquired spectrally differentiated NMR image data by finding a strong peak in each spectra per pixel or voxel; i.e. $H_2O$ peak in proton NMR imaging. Peak frequencies per pixel or voxel, in an ideal homogeneous magnetic field, should be all identical. In reality there is peak frequency shift. To correct for inhomogeneities of the magnetic field, the collected spectral data are shifted pixel by pixel or voxel by voxel so that all of the strong peaks, for example $H_2O$, are made to represent the same frequency. In this way other peaks like $CH_2$ and $CH_3$ will also be represented by their unique frequencies and can be separately displayed as an image which represents their location and amount in a patient, animal, or phantom.

8. Displays a "cine" series of images which are each mode of x.x parts per million portions of the NMR spectra, allowing the viewer of the "cine" series to visualize in a time sequence the spectral distribution of an image series of NMR images from patients, animals, or a phantom.

9. Displays a series of images as a single multiformat image with each image a selected portion of the NMR spectrum; i.e. phosphorus images with one of the multiformat quadrants representing an image of ATP peaks, another quadrant representing phosphocreatine, another representing inorganic phosphatate and the fourth quadrant representing all peaks added together to form a sum image.

10. Displays mathematically processed images using spectrally differentiated image data from selected peaks of the NMR spectra to form added, substracted, multiplied, or divided images to provide functional images; i.e. ratio images of ATP and phosphocreative inorganic phosphatate, an index of myocardial infarction.

11. Provides regional inhomogeneity-corrected spectra from a pixel or voxel or multiple pixels or voxels selected utilizing display regions of interest overlain on a spectroscopically differentiated image. This provides NMR spectral display from spectroscopically differentiated images which originate in selected locations of a patient, animal, or phantom from acquired image and spectrol data.

BRIEF DESCRIPTION OF THE DRAWINGS

In order that the invention will be more clearly understood, it will now be disclosed in greater detail with reference to the accompanying drawings, wherein.

DETAILED DESCRIPTION OF THE PREFERRED EMBODIMENTS

Figure 1:
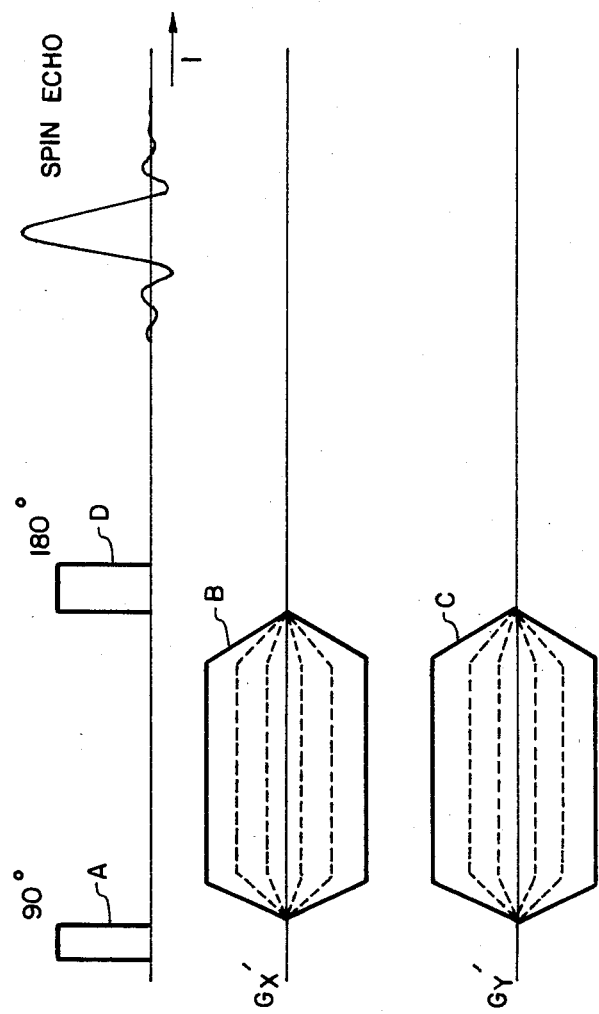
FIG. 1 is a time diagram showing the RF and magnetic field gradient sequence used for the observation of magnetic field distribution over two dimensions in the XY plane.

Field distributions of different regions can be measured be defining the shape of the object used to provide the NMR signal to suit the type of field measurement required. The region over which the field distribution is to be measured can either be in one, two or three dimension. For all variants, the basic sequence for the RF excitation, gradient switching and data acquisition is the same and is shown in FIG. 1, which uses as an example the measurement of the field distribution over a single two-dimensional plane. In this example, the object placed within the imaging region is a thin slice of suitable NMR-observable nuclei orientated in the plane over which the field measurement is to be made. Here the object is considered to be in the central transverse plane. A broadband RF excitation pulse A is used to excite all spins. The spins then evolve in the presence of the spatial encoding gradients whose amplitudes for this case are varied as $G'_x = l \cdot G_x$, and $G'_y = m \cdot G_y$, for all values of $l = -L/2$ to $L/2 - 1$ and $m = -M/2$ to $M/2 - 1$, in the manner of Fourier imaging (Kumar et al. 1975, supra). The NMR signal is then recalled by a 180° refocusing pulse D and the resulting spin echo is observed in the absence of any applied field gradient. During the observation period the spins therefore evolve under the influence of the magnetic field inhomogeneity perturbation effects only. The Fourier transform of each sample echo contains information on the field variations arising from the application of Gx' and Gy' which provide the spatial encoding information. Echoes are sampled for all values of both gradients, yielding a three-dimensional data set. A three-dimensional Fourier transform then provides a data set where two axes represent spatial coordinates, and the third axis is the NMR resonance frequency offset which is directly proportional to the field strength at each point in the X-Y plane.

We have applied this field measurement sequence to a variety of geometries and magnetic field distributions. The results were obtained using an experimental NMR imaging system with a superconducting magnet having a 250-mm room temperature bore and maximum field strength of 3 Tesla. Except where otherwise stated, all results were obtained at a field strength of 0.7 Tesla using proton resonance at 30 MHz. Clinical results are now being obtained from a 1.5 Tesla, 100 cm human investigational system. Using commercially available components the NMR imaging system was assembled with modifications for special applications. The three-dimensional data sets described in the following section are typically of 32 to 64 planes with a final image size of $128 \times 128$ points in each plane. Data collection times for the images shown are typically 30 minutes, though similar data with a slightly lower spatial resolution are frequently obtained in 10 minutes. Data processing times following acquisition are approximately 10 minutes using a VAX750 computer system with an Analogic AP400 array processor. For the two-dimensional data sets shown, a final image matrix of $512 \times 512$ points was used, typically interpolated from 256 original measurements obtained in a total time of under four minutes for data collection and data processing. Similar images of lower spatial resolution are typically obtained in half the time.

Figure 2:
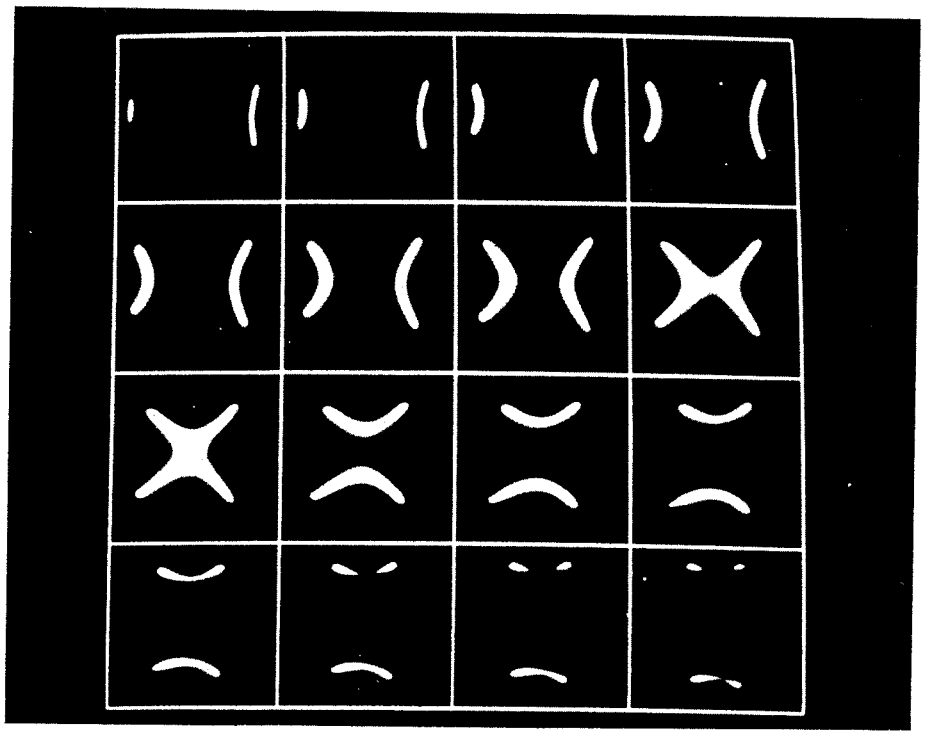
FIG. 2 illustrates several planes from the full three-dimensional data set showing the field variaton produced in the XY plane by changing the $[X^2-Y^2]$ shim. Successive images show the isofield regions over the two-dimensional object for increasing field strength from upper left to lower right. The field difference between each image is 2 ppm of the main field, or 0.014 Gauss.

Field distributions in the XY plane (with $B_o$ defined along the Z axis) can be measured by defining an object in that plane only. A circular phantom 93 mm in diameter and 10 mm thick was positioned in the central transverse plane of the magnet. FIG. 2 shows the result of the field measurement experiment when the magnetic field has been deliberately distorted by adding extra current to the $[X^2-Y^2]$ shim. Several slices from the full three-dimensional data set are shown, with each slice showing the distribution of spins which are resonating at a particular frequency for all points within the volume defined by the phantom object. The difference in field strength between successive planes is 2 ppm (parts per million) of the main field, the resolution having been reduced from the 1 ppm of the original data for the display.

Figure 3:
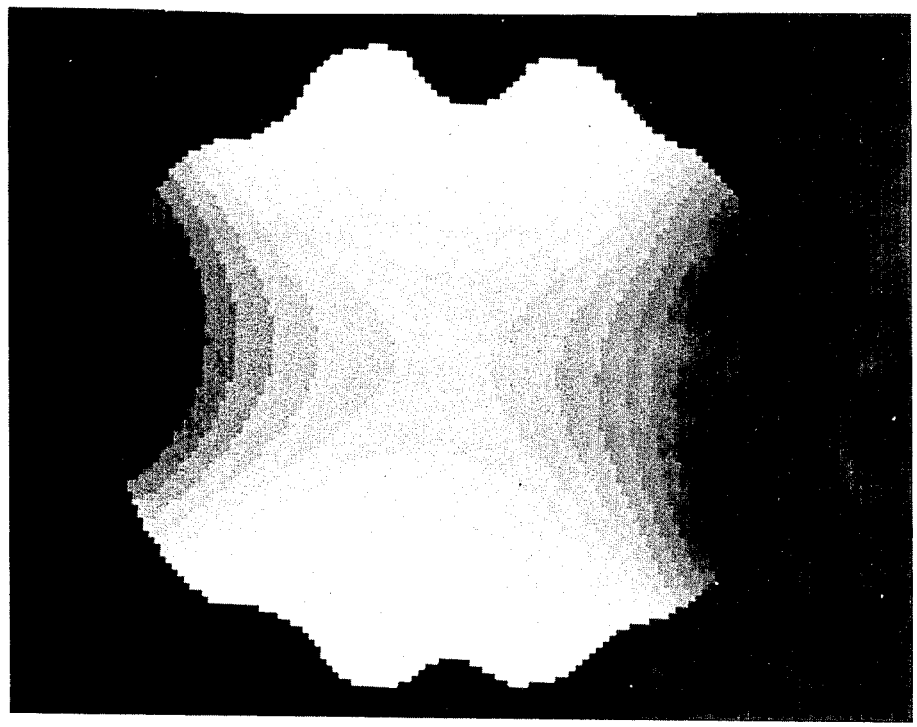
FIG. 3 shows field distribution obtained from the data of FIG. 2 for the $[X^2-Y^2]$ shim. The brightness of the image corresponds to the field strength with a scale of 2 ppm per grey level.

The full three-dimensional data set can be more conveniently viewed as a two-dimensional image with the brightness of the image representing the field strength. This is achieved by processing the image data to find the maximum intensity for each point in the line, measuring the frequency offset of the maximum value and displaying that value as the brightness of an image. As a consequence of this operation it should be noted that the spin density distribution within the phantom object as well as variations in the NMR signal intensity from inhomogeneity, become unimportant as long as the observed NMR signal is greater than the noise, since it is only the frequency offset of the maximum point which is taken. FIG. 3 shows the field distribution calculated from the data set shown in FIG. 2. At points where the maximum value in the frequency axis falls below a threshold value the image value has been set to zero. The brighter regions in the image correspond to higher field values with the variation between neighboring grey levels being 2 ppm, the resolution being reduced from that available in the original data to provide a more visually appealing display.

To demonstrate the effect of the various shims, data was taken with the [XY] shim incorrectly set. The [XY] shim performs field variations which are similar to the $[X^2-Y^2]$ shown in FIG. 3, but with a 45° shift so that variations are produced along the diagonals with no change along the axes. The $[Z^2]$ shim, in addition to producing a second-order axial variation, also produces a second-order radial variation. Somewhat irregular edges of these images arose because the phantom object has been defined to extend beyond the normal imaging region, right up to the RF coil. Close to the active portions of the coil, the large RF intensity variations result in the absence of any signal, however, the small RF intensity variations which exist in the imaging region do not affect this type of image.

In another example, field distributions in the YZ plane were obtained using a phantom object consisting of doped water in 5-mm od tubes, placed side by side to fill up the full imaging region. The Z axis was horizontal on both images. From images obained in both the axial and transverse planes, an understanding of the three-dimensional field variations of the various field correction terms can be obtained. Although the phantom object used was not a continous distribution of protons, but an array of tubes, the image appearance is generally continuous due to line-broadening effects and some smoothing of the data. Irregularities appear, however, at the front and back edges where the signal diminishes beyond the active volume of the RF coil. A high field gradient in the direction of the Z axis causes an early loss of signal due to excessive line-broadening effects over the system.

It should be noted that variations in the field do not cause any spatial distortion of the final image when the NMR signal is recalled as a spin echo using a 180° refocusing pulse, since field inhomogeneity effects are also refocused. This modification together with the use of varying the gradient intensity during a constant dephasing time period offers significant advantages over the data acquisition method originally proposed in the above-noted publications of Zumar et al. and Maudsley et al. 1979. Nonlinear field gradients will, however, cause spatial distortions. To more conveniently assign field strengths to precise spatial locations, an alternative approach is to define the phantom as a discrete array. For example, small samples of water positioned in a rectangular array allow a direct measurement of the field at each point.

The use of observation of nuclei, such as phosphorus and sodium, other than protons illustrates the possibility of mapping high field strengths where the high resonance frequency of protons may present problems in RF coil design or receiver bandwidth.

Interpretation of field inhomogeneity effects is frequently simplified and the data collection times are significantly reduced if the data is limited to a single spatial dimension. For example, the field variation along the axial direction can be measured by choosing the object to be a single, narrow tube aligned along the central Z axis. By performing a two-dimensional imaging sequence with phase encoding now performed for a single spatial dimension by using successive applications of the Z gradient only, a two-dimensional image is obtained with the spatial dimension (along Z) as one axis and the field (or frequency) variation along the second axis. Axial shims above first order also contribute radial terms which must be considered when shimming in order that radial homogeneity is not sacrificed for axial homogeneity.

Radial terms of the field variation can be more directly observed by defining the object over the region of interest, which can be done by an annular phantom made of a water-filled tube. With this phantom positioned in the XY plane, it is possible to obtain an image with the spatial axis as either the X or the Y dimension depending on which gradient is used to provide spatial encoding, and indeed different information can be obtained in each case. Since the field variations produced by this shim now lie along the diagonals, the result when viewed from either the X or the Y axes is a figure eight. The interpretation of images of this type for correction of the radial terms of the field distribution may take the following cases: a curved appearance of the image can be corrected for by using the $[X^2-Y^2]$ shim, a loop appearance can be corrected with the $[XY]$ shim, and a slope of the line or separation of the signals from the opposite halves of the annulus can be corrected by the appropriate linear gradient or a combination of second-order shims, whichever is appropriate.

We have used this field measurement method to observe the effects of surrounding steel on magnetic field homogeneity. Of particular interest is the effect of steel deliberately introduced for the purpose of magnetic shielding. To observe this effect, we have obtained field measurements with a plate of steel 3/16 inch thick and four feet square, placed parallel with the magnet axis 29 inches from the center of the magnet. The effect of a single plate of steel is to create a strong field gradient, primarily of first order, across the imaging region. With the addition of a second steel plate of the same dimensions placed symmetrically on the opposite side of the magnet the odd-ordered terms are cancelled while even-ordered terms remain. Steel plates placed in this fashion destroy the radial symmetry of the field, which can then be corrected for by second-order radial shims. This correction procedure is achieved by shifting the frequency data for all points in X and Y by an amount specified in a correction data set which is simply a map of the normal field inhomogeneity. The discrete nature of the field measurement causes the banding appearance of the image between two intensity levels as small variations in the RF reference frequency and in shim settings between the two measurements indicate that the isofield lines no longer coincide.

By obtaining a complete set of images of the field distributions provided by all of the different shim sets, a conceptual understanding of the effects of each of the shims and their application in the shimming procedure can be rapidly gained. In our experience we have found that this method of field measurement, using a combination of axial and radial one-dimensional plots and two-dimensional plots of the three orthogonal planes, with a visual interpretation of the results to determine the terms of the field distribution, has greatly increased the speed of the shimming procedure. The time needed to shim has been reduced from days when using a point-by-point field measuring method, to hours using this NMR imaging method. By calibrating each of the shims for the corresponding field measurement procedure a direct quantitative measurement of the field distribution can be made, and these values can than provide the incremental change of the corresponding shim needed to correct for the observed field distortion. With further refinement of the technique and the addition of suitable line fitting procedures, the whole field measurement and shimming procedure may be fully automated.

The field measurement technique is also applicable for imaging of chemically shifted NMR spectra. Indeed, as a necessary part of the chemical shift imaging experiment the full distribution must be measured and the effects corrected for in the final chemical shift image. Further application of this method is also to be found in designing or modeling of magnetic shielding or observing the effects of surrounding steel. Although these observations can be made by extensive computer simulation, a simpler approach may be to first model the situation using a smaller magnet system and to directly observe the effects.

In accordance with the invention then, a field homogeneity image for use in a field correction algorithm may be acquired by the following procedure:

(a) An object such as a phantom filled with a solution of a suitable type of NMR-observable nuclei or a biological specimen such as a patient or animal is placed in an NMR imaging system.

(b) For protons, the preferred solution used is a lightly doped $Ni2+$ solution of water. For phosphorus, a sodium phosphate solution is preferred.

(c) The phantom, animal, or patient is then scanned using a field plot imaging sequence to determine the local field homogeneity.

(d) This is accomplished by a variation of Fourier imaging. To acquire a full-volume field homogeneity plot requires a 4D imaging sequence to get three spatial coordinates and one frequency coordinate. This is accomplished in the following manner: a nonselective 90° pulse is applied which excites all the spins in the imaging region; following this pulse, successively varied gradients are applied using all three (orthogonal) field gradients. At a time T after application of 90° pulse, a nonselective 180° pulse is applied, causing a spin echo to occur at time 2T. Data collection is centered around this spin echo. This results in $N_x \times M_y \times L_z$ measurements. Typically, $N_x=M_y=L_z$ yields a cubic matrix. A 4D Fourier transform must be used to provide the 3D field plot. Display of this type of image is difficult but can be accomplished using the technique described in the following paragraphs.

A useful variation on this technique is to limit one spatial axis by some other means (described below) and image a planar slice. For a 2D (spatial) field plot, a 3D Fourier imaging sequence must be used. This may be accomplished in either of two ways. First, a phantom is used to define a limited region over which the field values are to be measured. A type of single resonant-line nuclei is used (as described above) and the following sequence is used. (See FIG. 1.) A nonselective 90° pulse is applied, followed by application of successively different field gradients in the two directions orthogonal to that of the plane of the phantom. At a time T after application of the the 90° pulse, a nonselective 180° pulse causes a spin echo to occur at time 2T. The data from the spin echos are collected in the presence of local field variations only. the second method of field plots involves the use of the object itself to provide the field map. The advantage of this is it account for dielectric effects in the object that can influence the local field strength. Since a slice must be selected from the whole object, selective 90° and 180° pulses in the presence of a selecting gradient perpendicular to the desired plane must be used in place of the nonselective pulses in the technique described above. A 3D Fourier transform is then performed on the data.

(e) Frequency selection is determined by data sampling rate and the total number of points in the first Fourier transform (FT). The actual number of discrete frequencies for final display and subsequent processing is a function of the number of points selected from the first FT. Typically, 64 points out of 256 or 512 points are selected for the subsequent second and third FT.

(f) The results of a 3D FT yield successive images of the phantom or of a slice of the patient or animal, where each image shows the region of the object at the particular field strength (not the spin density). RF inhomogeneities do not effect this type of image.

In order to provide a convenient display of field data and processing to yield a correction image, in accordance with the invention:

(a) To interpret the results of the 3D FT, we define a coordinate system with Z being the frequency axis and X and Y being the spatial axes. Each point in XY every plane along Z corresponds to a fixed location in the object. The frequency offset is found for each point in X and Y by determining which plane in Z has the maximum signal, and subtracting this value from the Z plane that has zero frequency offset (i.e. the no-gradient resonant frequency).

(b) A grey scale is assigned to each of these frequency offsets and a new image is made using the assigned grey scale level for each point in X and Y. This image represents the field value at each location rather than the spin density.

(c) By choosing the maximum value at each set of points in X and Y along Z, we can select one peak from a multiline NMR spectrum and, hence, this technique can be easily applied to in-vivo field plots of both protons and phosphorous.

(d) This method can be extended to 4D data in the following way: The maximum value for each spatial location (now coordinates X, Y, and Z are all spatial) is determined from the frequency planes f and each point is assigned the appropriate grey scale level. This effectively compresses a 4D data set into a 3D data set and when displayed, yields sets of images with each image being a 2D field plot and successive images varying the third dimension.

(e) This image can be windowed to reduce edge artifacts and ussed as a homogeneity correction for chemical shift images as described in the following paragraphs.

The application of nuclear magnetic resonance (NMR) in the clinical environment has developed rapidly in recent years with the introduction of imaging of proton density distributions within the body. This new imaging modality offers the potential of visualizing soft tissue distributions within the body with a high degree of contrast and good spatial resolution in a non-invasive and harmless manner. On the other hand, NMR has also been used for a number of years as a spectroscopic method for biochemical studies, its application being concentrated to a large degree on the observation of nuclei other than protons, including carbon-13, phosphorus-31 and, to a lesser extent, sodium-23. These nuclei occur within the body in compounds which play an important role in metabolism, they are present at high enough concentrations to permit detection by NMR, and observation of the intensities and frequencies of their resonances permits relatively simple interpretation. The low sensitivity of the NMR observation of these nuclei relative to protons has largely been overcome in recent years with the development of spectrometer systems using higher magnetic field strengths, and experimental results indicate that considerable information can be gained by these methods (D. G. Gadian: "Nuclear Magnetic Resonance and Its Applications to Living Systems." Oxford, Clarendon Press, 1982). Of particular interest is the observation of phosphorus-31, which has major signal contributions arising from ATP, ADP, phosphocreatine (PCr), inorganic phosphates (Pi) and sugar phosphates (mainly glucose 6-phosphate), all of which play a vital role in metabolism and have been studied extensively.

Conventional analytical NMR spectroscopy was limited for many years to observations in vitro and the realization that this type of measurement may not accurately reflect the conditions which exist in vivo has led to the development of techniques which can more accurately observe the conditions within living systems. These include the use of perfused organs (P. Garlick, G, Radda, P. Seeley: "Phosphorus NMR Studies on Perfused Heart". Biochem. Biophys. Res. Comm. 74: 1256, 1977 and A. C. McLaughlin, H. Takeda, B. Chance:'- 'Rapid ATP Assays in Perfused Mouse Liver by $^{31}$p NMR". Proc. Natl. Acad. Sci. 76: 5445–5449, 1979), freeze-trapped assays (B. Chance, Y. Nakase, M. Bond, J. S. Leigh, G. McDonald: "Detection of $^{31}$p Nuclear Magnetic Resonance Signals in Brain by In Vivo and Freeze-Trapped Assays". Proc. Natl. Acad. Sci. 75: 4925–4929, 1978), techniques which limit the NMR measurement to a limited region by "surface coil techniques" (J. J. Ackerman, T. H. Grove, G. G. Wong, D. G. Gadian, G. K. Radda: "Mapping of Metabolites in Whole Animals by $^{31}$p NMR Using Surface Coils". Nature (London) 283: 167–179, 1980), "field focusing" (R. E. Gordon, P. Hanley, D. Shaw, D. G. Gaidan, G. K. Radda, P. Styles, P. J. Bore, L. Chan: "Localization of Metabolites in Animals Using $^{31}$p Topical Magnetic Resonance." Nature (London) 287: 736, 1980), or "sensitive point" (K. N. Scott, H. R. Brooker, J. R. Fitzsimmons: "Phosphorus NMR: "Potential Applications to Diagnosis. In *Nuclear Magnetic Resonance (NMR) Imaging.*" Edited by Partain, James, Rollo and Price. Philadelphia, W. B. Saunders, 1983, pp. 416–425) techniques. The techniques currently used for proton imaging are not directly applicable to the observation of multiple-line NMR spectra since the methods used to provide the spatial discrimination generally obscure the desired spectral information. We have now demonstrated an extension of the Fourier imaging method to perform spatially resolved spectroscopy (A. A. Maudsley, S. K. Hilal, W. H. Perman, H. E. Simon: "Spatially Resolved High Resolution Spectroscopy by "Four Dimensional" NMR". J. Magn. Reson. 51: 147–152, 1983). The information obtained by this technique can be displayed as either the two (or three) dimensional distributions of a specific compound or NMR resonance or, alternatively, the full NMR spectrum which arises from each point within the object. This method provides a combination of the powerful analytical capabilities of NMR spectroscopy and the ability to image within the body in a harmless and non-invasive manner. The method can therefore be used for in-vivo spectroscopic analysis. First demonstrated for the observation of $^{31}p$ spectra in a phantom object, the method can also be applied to the observation of a spatially resolved spectra of other nuclei (I. L. Pykett, B. R. Rosen: "In Vivo Proton Chemical Shift Imaging by Nuclear Magnetic Resonance". Radiology 149: 197–210, 1983, and A. A. Maudsley, H. K. Hilal, H. E. Simon, S. Wittekoek: "Multinuclear Applications of Chemical Shift Imaging." Proc. Soc. Magn. Reson. Med., San Francisco 1983, p 230).

We shall now describe the application of this method, as an example, to in vivo observation of $^{31}p$ in the cat to observe changes associated with ischemia and stroke.

The sensitivity for the NMR observation of $^{31}p$ is 0.066 relative to proton observation (at the same field strength). In addition, the concentration of phosphorus within tissues is considerably smaller than for protons, with values in the range of 30 mM for PCr to 3 mM for ATP in comparison with around 82 M for protons in muscle tissue. The sensitivity for NMR observation of $^{31}p$ in tissue is therefore between 10,000 and 100,000 times lower than for protons. Furthermore, the relatively long longitudinal relaxation times ($T_1$) of phosphorus compounds further reduce the relative NMR sensitivity. As a result, for $^{31}p$ spectroscopic imaging a much reduced image quality and longer data acquisition times must be accepted. By making use of a high-field-strength superconducting magnet system, we have been able to obtain images of separate compounds in vivo. The imaging system used was based on a 3 Tesla superconducting magnet with a 25-cm bore, operated at 2.7 Tesla for the following results:

Methods and Results

Figure 4:
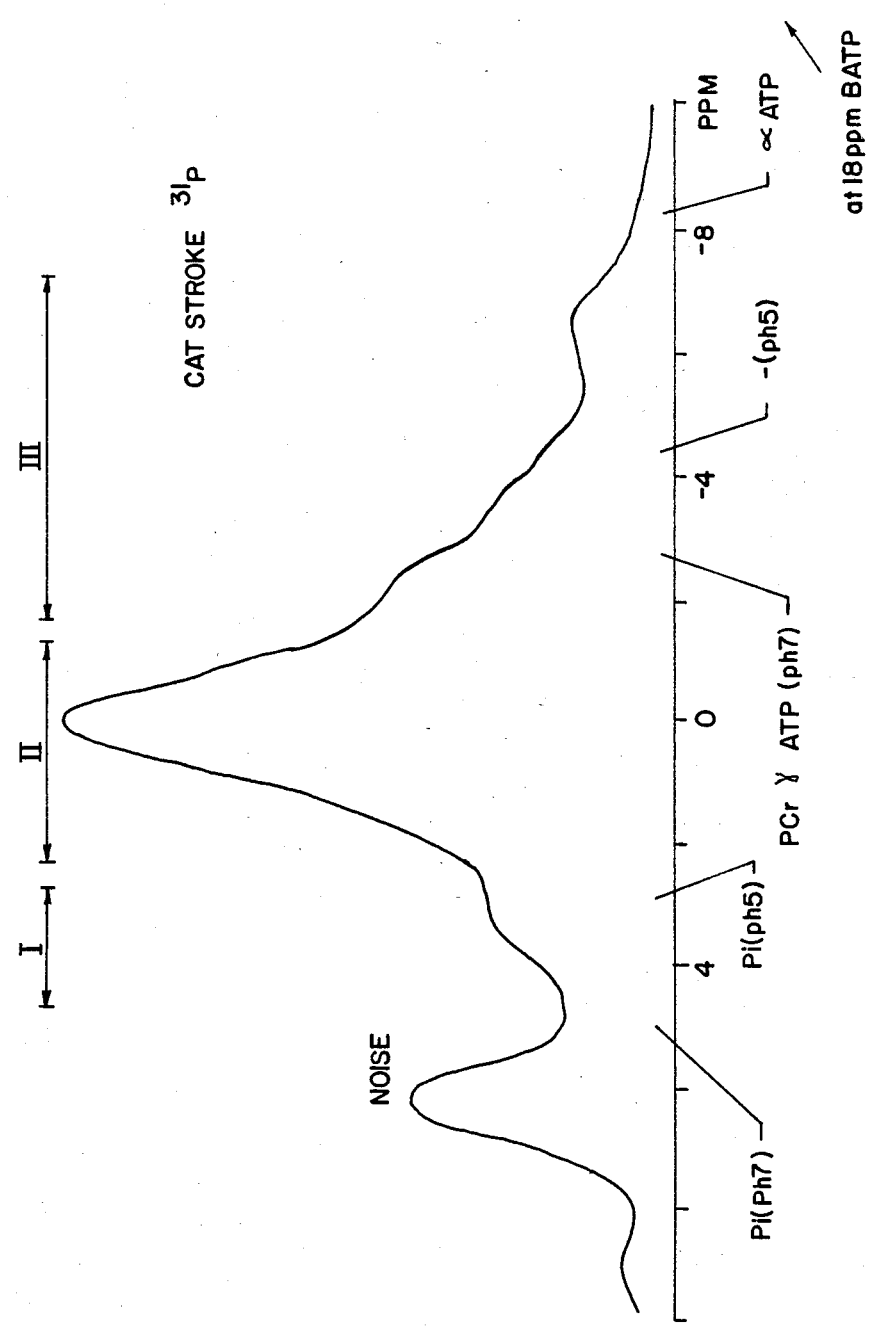
FIG. 4 shows the phosphorus NMR spectrum obtained from the whole section through a cat head with expected peak assignments indicated relative to phosphocreatine, which is assumed to be at the maximum. The individual lines are unresolved for reasons described in the disclosure.

A 3-D Fourier imaging sequence was used, as shown in FIG. 1, to provide the high-resolution spectra for all points within a single plane. A selective 90° pulse was used to excite all spins within a slice perpendicular to the axis of the magnet of 1.5 cm thickness. Spatial discrimination within the plane was achieved by the successive application of phase encoding gradients applied in the X and Y axes. Typically, 20×20 or 16×16 different gradient values were used. Following application of the phase encoding gradients a nonselective 180° refocusing pulse was used to obtain a spin echo 28 msec after the excitation pulse. The spin echo was sampled in the absence of any field gradient and the Fourier transform of this signal provides the high-resolution NMR spectrum, with the phase and intensities modified by the action of the phase encoding gradients. In order to improve the signal-to-noise ratio of the data, additional 180° pulses were used to recall spin echos up to a total of four items with each echo sampled and coherently summed. The spin echos were sampled to provide a resolution of 1 ppm following Fourier transformation of the time data. The short data sampling period was chosen to optimize the signal-to-noise ratio at the expense of a reduced spectral resolution, resulting in only limited separation between the chemically shifted $^{31}p$ resonances. In addition, due to the use of a spin echo sequence where data collection occurs some time after the initial excitation pulse, the $\alpha$ and $\beta$ ATP peaks are not observed due to the short $T_2$ values of these peaks. Finally, field inhomogeneity over the whole of the object causes further line broadening and the spectrum from the whole object shows no clearly resolved NMR resonances, as shown in FIG. 4, which is the spectrum obtained from the head of a cat following stroke and corresponds to the data shown in FIG. 6. The approximate assignments of the major $^{31}p$ components are indicated in FIG. 4, where we also show a range of positions corresponding to a range of pH values within the tissue, since the chemical shift of these liens is pH dependent (R. B. Moon, J. H. Richards: "Determination of Intracellular pH by $^{31}p$ Magnetic Resonance". J. Biol. Chem. 248: 7276–7278, 1973).

The observation of spectra at each spatial location does allow observation of the separate peaks, predominantly PCr, Pi and, less clearly resolved, the $\gamma$ ATP peak, since it is only the field inhomogeneity over the voxel that contributes to the field inhomogeneity line broadening at that position. The variations in field strength over all points within the plane can be corrected for by suitable data processing and an image of each chemically shifted line formed. However, with this correction, no significant improvement in the appearance of the images was found with the following data and no such correction has been done. By integrating the frequency data over a number of points, as indicated by the sections I, II and III of FIG. 4, for all points within the image plane, some further improvement in the signal, to noise ratio is possible in the formation of separate images for each chemical group, namely the Pi, PCr and ATP contributions, respectively. In addition, we obtain a single image of the total $^{31}p$ distribution within the object. This process also serves to reduce the data storage requirements which can become significant when dealing with such three-dimensional data sets. We have found it informative to display both the two-dimensional distribution of each compound as well as the full spectrum from selected points within the plane. For the composite images shown, the individual images have been separately windowed where necessary due to the large variation in intensities between each data set.

Figure 5:
FIG. 5 shows total phosphorus, Pi and PCr density distributions through a normal and an ischemic cat leg following application of a tourniquet to the left leg.
Figure 6:
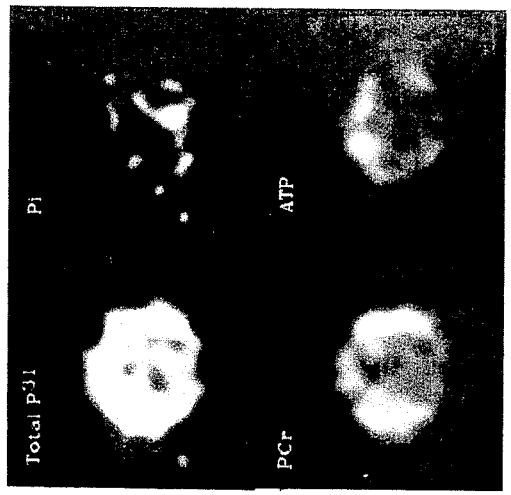
FIG. 6 shows phosphorus density distributions across a section through the head of a cat obtained over a period of four hours following formation of a stroke in the left-hand side of the brain (right-hand-side of the image). The brighter total phosphorus signal arises from the muscle and tissue surrounding the skull.

A repetition period of 750 msec was used for the data of FIGS. 5 and 6. The resonance frequency was 46 MHz. Signal averaging was performed to improve the signal-to-noise ratio and the total data acquisition times were four hours.

a. Ischemia in the leg of a cat

As an initial test of the feasibility of the experimental method, a tourniquet was applied around the thigh of a cat and the ischemic region of the leg below the tourniquet imaged. FIG. 5 shows the resultant total $^{31}p$, the Pi and the PCr distributions, which demonstrate an increase in Pi and an decrease in PCr for the ischemic leg, which is on the left of the image. The total $^{31}p$ concentration, however, remains constant.

b. Cat stroke model

Figure 7:
FIG. 7 shows $^{31}p$ spectra at selected positions indicated by arrows on the total phosphorus image from the same data as FIG. 6. The large peak within the surrounding muscle tissue is PCr. Within the brain on the left-hand side of the image, only the PCr peak is present, while a second peak corresponding to the increased Pi in the region of stroke is clearly shown on the right side of the image.

A cat was anesthetized with sodium pentobarbital and a stroke was produced over a large region of one hemisphere of the brain by injecting 2 ml of ethyl alcohol into the left carotid artery, followed by ligation of this artery. Imaging of the $^{31}$p within the cat head was started immediately after formation of the stroke and the result is shown in FIGS. 6 and 7. FIG. 6 shows the separate $^{31}$p distributions in a transverse section through the head of the cat, which is lying supine. FIG. 6 shows the phosphorus within a 1.5 cm thick section through the head in the region of the brain; most distinctive are the strong total $^{31}$p and PCr signals from the muscle region in comparison to the brain region, which appears as the darker region at the lower part of the image. The ratio of PCr in muscle to that in brain is between 2.5 and 6. The Pi contribution is small and not sufficiently well resolved above the noise. In the frequency spectrum shown in FIG. 7 the Pi and PCr lines are clearly resolved, but the $\gamma$ ATP peak appears as only a shoulder of the PCr peak. As this ATP peak is not clearly resolved, a major contribution to the signal intensity of the corresponding image of FIG. 6 arises from the shoulder of the more intense PCr line. No signal contribution from phosphodiesters, observed in a similar model, can be identified, possibly due to the short $T_2$'s of these lines. Within the brain, large differences in the spectra can be seen between each side, with a much larger Pi peak being present on the left side of the brain (shown here on the right side of the image) indicating a region of ischemia.

An image has also been generated by taking the ratio of the Pi distribution to the sum of Pi and PCr, which provides some normalization of the data, and allows any increase in the Pi level to appear more clearly as an increase in brightness. In generating this type of image, some windowing of the data is necessary in order to suppress small signals outside of the object where the ratio Pi/[Pi+PCr] becomes large due to noise. A bright region in such image indicating the increased Pi levels within the left side of the brain was evident, as expected from FIG. 7. It is expected that partial volume effects play a role in modifying the peak intensities as the relative change of Pi and PCr levels during acute ischemia may be expected to be greater than that indicated here. Peak heights may also be modified due to differences in $T_1$ between the different resonances, though our observations indicate that at the repetition period used this effect is small.

With currently available NMR imaging apparatus we are able to image spatial distributions of Phosphorus-31 in vivo with reasonable spatial and frequency resolutions, permitting a direct observation of the extent of stroke. The application of this type of observation must be considered in relation to the relatively long total data acquisition times which must preclude the type of dynamic studies possible using surface coil techniques (B. Chance, S. Eleff, J. S. Leigh, C. Barlow, L. Ligetti, L. Gigulai: "Phosphorus NMR." In *Nuclear Magnetic Resonance (NMR) Imaging* Edited by Partain, James, Rollo and Price. Philadelphia, W. B. Saunders, 1983, 399-415; R. T. H. Edwards, M. J. Dawson, D. R. Wilkie, R. E. Gordon, D. Shaw: "Clinical use of nuclear magnetic resonance in the investigation of myopathy." Lancet March 27: 725-731, 1982; and K. L. Behar, J. A. Den Hollander, M. E. Stromski, T. Ogino, R. G. Schulman, O. A. C. Petroff, J. W. Prichard: "High-resolution $1_H$ nuclear magnetic resonance study of cerebral hypozia in vivo." Proc. Natl. Acad. Sci. U.S.A. 80: 4945-4948, 1983.) These techniques permit NMR observation of only a limited region with relatively high sensitivity, but suffer from the disadvantage of providing an obtained signal from a single, poorly defined region. (M. R. Bendell, R. E. Gordon: "Depth focussing pulses designed for multipulse NMR with surface coils." J. Magn. Reson. 53: 365-385, 1983) Observations of large differences in $31_p$ concentrations within muscle and brain indicate that, for surface coil studies of the brain, caution is necessary to avoid pollution of the desired brain signal by the muscle. This disadvantage is overcome by the present invention. In addition to the observation of regions of ischemia, the in vivo application of $31_p$ spectroscopic imaging may provide further information on tumor growth and metabolism (T. C. Ng, W. T. Evanochko, R. N. Hiramoto, V. K. Ghanta, M. B. Lilly, A. J. Lawson, T. H. Corbett, J. R. Durant, J. D. Glickson: "$^{31}$p NMR spectroscopy of in vivo tumors." J. Magn. Reson. 49: 271-286, 1982), leading to greater diagnostic specificity. With increased sensitivity providing better spectral resolution, $31$p NMR also permits the measurement of pH values in vivo.

It is of interest to extrapolate our present results to the clinical application of phosphorus. Assuming the same experimental technique with the same sensitivity of detection, though using a lower noise preamplifier than that used for these experiments (1 dB noise instead of 2.5), then for imaging of the head with a 25 cm diameter coil, at a field strength of 2 Tesla, it is estimated that imaging times of the order of one hour for a spatial resolution of 2.0 cm are necessary. The use of field strengths up to 3 Tesla would permit more reasonable data acquisition times of the order of 30 minutes. Even at the low values of spatial resolution, considerable information can be otained from the $^{31}$p spectra. We have investigated the feasibility of the clinical application of phosphorus imaging using a 1.5 Tesla whole body magnet system. Observations within heads and limbs have been performed with some success. For imaging of nuclei other than protons, phosphorus appears to be less practical than sodium imaging, where images through the head having a spatial resolution of approximately one centimeter have been obtained within 34 minutes (S. K. Hilal, A. A. Maudsley, J. Bonn, H. E. Simon. "Paper 126, presented at RSNA meeting." Chicago, 1983) and spatial resolution of 2 mm obtained in animals (S. K. Hilal, A. A. Maudsley, H. E. Simon, et al: "In vivo NMR imaging of tissue sodium in the intact cat before and after acute cerebral stroke." Am. J. Neuroradiol. 4: 245-249, 1983.)

In accordance with the invention, the chemical shift imaging of protons or phosphorus with correction for static field inhomogeneity may be summarized as follows:

(a) For imaging nuclei which have a multiline spectrum such as phosphorus, a 3D Fourier imaging sequence is applied to a patient or animal (or a phantom).

(b) The application of pulses and dephasing gradients is the same as described above. The schematic for this sequence is shown in FIG. 1.

(c) A Fourier transform of each spin echo data collection yields the high-resolution NMR spectrum of the object, modified by the action of the different dephasing gradient. Second and third Fourier transforms produce a set of 2D images of the object with each chemically shifted species in a different plane (or planes depending on the line width).

(d) Additional echos may be acquired for initial excitation, thus improving the signal-to-noise ratio. Another signal-to-noise ratio improvement involves grouping sets of images that represent that entire line width of the species. In addition, this reduces data storage considerably.

(e) The grouping of individual chemical groups can be extended to grouping of all the images to produce a composite image or to grouping of only some of the different groups together.

(f) For obtaining chemically shifted images in the presence of large static field inhomogeneities, the field plot images can be used to adjust the frequency shifts of each chemical group by adding or subtracting the main field frequency offset from resonance at each spatial location to the frequency of each chemical species at that location.

In addition, in a further feature of the invention, NMR spectra can be obtained from localized regions by the following procedure:

(a) Since each point (X, Y) in a chemically shifted image is at the same spatial location, a plot of each value $(X, Y)_n$ from 1 to n yields the high-resolution NMR spectra fom that location only.

(b) Thus, regions close in space can be compared for chemical differences without the fear of mixing intensities.

As an example only, NMR techniques in accordance with the invention may be employed for the following hypothetical cases:

A. A patient suspected of having artereosderotis disease causing stroke symptoms is imaged using the technique of this invention. Spectroscopically differentiated proton imaging provides multiple images per anatomical slice each from a different segment of the proton spectrum. The diagnostician selects four integrated images for viewing from many.

(1) The proton $H_2O$ water image.
(2) The proton $CH_2$ lipid image.
(3) The proton $CH_3$ fatty acid image.
(4) Total proton sum of peaks image.

On the $CH_2$ image, the diagnostician notes brightness in the bifurcation of one of the internal carotid arteries and can diagnose the location of an artereosclerotis plaque.

B. A patient with severe angina pain is imaged utilizing the technique described in this patent disclosure. Spectroscopically differentiated phosphorus ($^{31}p$) imaging of the heart in an apical projection to minimize motion is acquired. The diagnostician first views either the multiformat spectra imaging matrix display or the cine display where each image represents $\frac{1}{4}$ ppm and looks for areas of inorganic phosphate peaks which in several images are regionally brighter than normal. The diagnostician selects a region of interest in the area of abnormal brightness and another region which looks normal with ATP and phospho-creatine. He compares displaed spectra and as a result can localize the area and extent of insult to the myocardium, determine myocardial pH and also re-image to monitor drug or surgical intervention response.

Our above disclosed invention can be applied to any generic NMR imaging device. A generic NMR imaging device is defined as a system in which a patient, animal, or phantom is placed in a magnetic field that is as homogeneous as possible. The patient, animal, or phantom emits positionally encoded radio frequency signals in response to imposed gradient magnetic fields and radiofrequency pulses. The emitted radio frequencies are then utilized to form anatomical images which display NMR parameters of combinations of NMR parameters.

The development of techniques in Fourier imaging is also discussed in "Spatially Resolved High Resolution Spectroscopy by 'Four-Dimensional' NMR", A. A. Maudsley, S. K. Hilal, W. H. Perman and H. E. Simon, Journal of Magnetic Resonance Vol. 51, No. 1, January 1983, pp 147-152, Academic Press, N.Y., published on Feb. 4, 1983 with the authorization of the present inventors. This publication is encorporated by reference herein.

Figure 8:
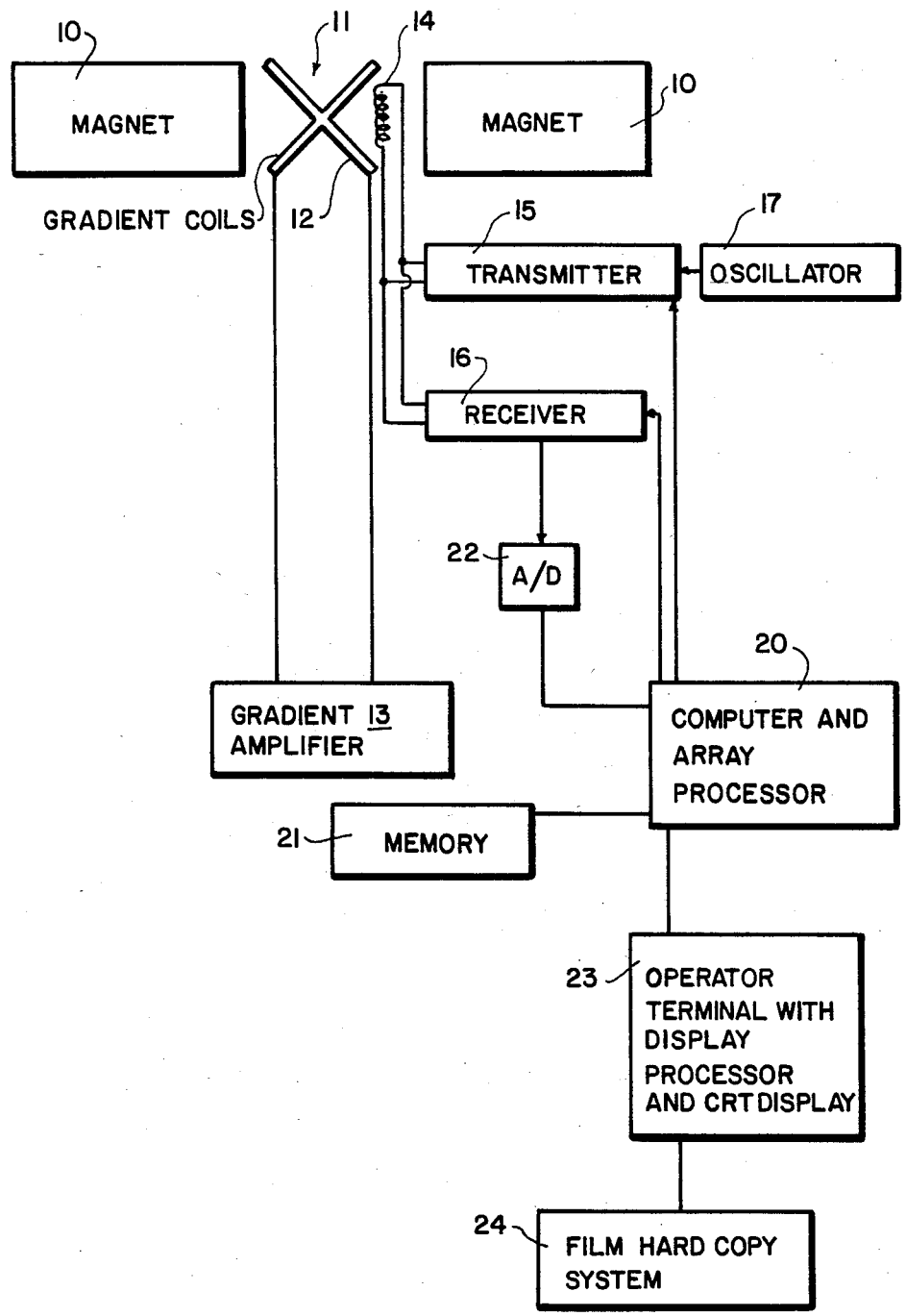
FIG. 8 is a block diagram of the structure of a system which may be employed in the practice of the present invention.

Conventional NMR imaging systems may be employed in the practice of the invention. For the sake of completeness, however, FIG. 8 is a block diagram of conventional elements that may be employed in such a system. Referring now to FIG. 8, a magnet 10 has a volume position 11, where a patient, animal or phantom may be placed, the field in the volume position 11 being as homogeneous as possible. Gradient coils 12 and their amplifiers 13 provide a gradient magnetic field in the volume position 11. Radiofrequency coil 14 transmits radiofrequency signals from a radiofrequency transmitter 15 and applies received radiofrequency signals to radiofrequency receiver 16. The signals transmitted by the transmitter have a frequency determined by the frequency source 17. A computer and array processor 20 is provided for processing data, the computer having memory, such as bulk, archival and on line memory 21. The output of the radiofrequency receiver 16 is applied to the computer by way of an analog-to-digital converter 22. A suitable operator terminal 23 is provided, including CRT displays. A hard copy system 24 may also be provided. The computer and array processor 20 is provided with software, in accordance with the present invention.

Computer programs affixed hereto as an appendix disclose algorithms employed in accordance with the invention. These programs were developed for a PDP 11/34 AND VAX 11/750. The program FIELD provides the algorithm for a homogeneity mapping. The program FSELECT provides frequency mapping of inhomogeneity, and the program FSHIFT provides the frequency shifting employed in accordance with the invention to correct for inhomogeneity. The program FIELD .FTN takes the acquisition of pulse sequences for spatial and spectral data. The portion of the appendix entitled NMR Software discloses various display methods in accordance with the invention.

While the invention has been disclosed and described with reference to a limited number of embodiments, it is apparent that variations and modifications may be made therein, and it is therefore intended in the following claims to cover each such variation and modification as falls within the true spirit and scope of the invention.

What is claimed therein:

1. A method for producing an image representative of nuclear spin density data, employing nuclear magnetic resonance performed by a species of nuclei in a test object to be sampled, comprising the steps of:
   (a) placement of a phantom object containing NMR-observable nuclei in a constant magnetic field oriented in a direction parallel to a first axis;
   (b) application of a radiofrequency excitation pulse to excite spins of said nuclei in said phantom object;
   (c) application of first and second linear magnetic field gradients along mutually orthogonal second and third axes lying in a first plane passing through said phamtom object, during which application the spins of said nuclei evolve;
   (d) application of a refocusing pulse to produce a spin echo;

(e) detection of said spin echo in the absence of said first and second magnetic field gradients;

(f) conversion of said spin echo into a first set of electrical signals;

(g) repetition of steps (b)–(f) wherein the amplitudes of said first and second magnetic field gradients are successively varied for each application, thereby producing a multiplicity of sets of electrical signals;

(h) processing of said electrical signals to obtain a correction data set reflecting the deviation of said constant magnetic field from homogeneity in said first plane;

(i) storage of said data correction set in the memory of a computer;

(j) storage of a nuclear spectral data set in said computer, said nuclear spectral data set being the result of placing a test object in said constant magnetic field, performing steps (b)–(g), and processing the resulting electrical signals, said nuclear spectral data set reflecting the spin density of said nuclei in said test object in said first plane; and (k) performance of a correction procedure whereby the values represented in said nuclear spectral data set are adjusted for each point in said first plane by the amounts specified by the corresponding values in said correction data set, thereby correcting said nuclear spectral data set to account for the inhomogeneity of said constant magnetic field.

2. A method as defined in claim 1, wherein said step of conversion of said spin echos into electrical signals comprises sampling.

3. A method as defined in claim 1, wherein said correction data comprises values representing resonance frequency offset.

4. A method as defined in claim 1, wherein said processing of electrical signals into data comprises three-dimensional Fourier transformation, said data including two spatial coordinates and the resonance frequency offset, which is directly proportional to the field strength at each point in said first plane.

5. A method as defined in claim 1, wherein said excitation pulse is a 90° pulse.

6. A method as defined in claim 1, wherein said refocusing pulse is a 180° pulse.

7. A method as defined in claim 1, further comprising the step of imaging said corrected nuclear spectral data in a two-dimensional array of pixels, wherein the degree of brightness of each pixel represents the nuclear spectral quantity measured at a corresponding point in said first plane.

8. A method as defined in claim 4, wherein said processing includes defining a coordinate system with Z being the frequency axis and X and Y being the spatial axis, determining which plane in Z has the maximum signal, and subtracting this value from the Z plane that has zero frequency offset to obtain the frequency offset for each point in X and Y.

9. A method as defined in claim 1, wherein said values are spin frequencies and said correction is performed by frequency shifting.

10. A method of producing an image representative of nuclear spin density data, employing nuclear magnetic resonance performed by a species of nuclei in a test object to be sampled, comprising the steps of:

(a) application of a phantom object containing NMR-observable nuclei in a constant magnetic field oriented in a direction parallel to a first axis;

(b) application of a radiofrequency excitation pulse to excite spins of said nuclei in said phantom object;

(c) application of a linear magnetic field gradient along said first axis;

(d) application of a refocusing pulse to produce a spin echo;

(e) detection of said spin echo in the absence of said magnetic field gradient;

(f) conversion of said spin echo into a first set of electrical signals;

(g) repetition of steps (b)–(f) wherein the amplitude of said magnetic field gradient is successively varied for each application, thereby producing a multitude of sets of electrical signals;

(h) processing of said electrical signals to obtain a correction data set reflecting the deviation of said constant magnetic field from homogeneity along said first axis;

(i) storage of said data correction set in the memory of a computer;

(j) storage of nuclear spectral data set in said computer, said nuclear spectral data set being the result of placing a test object in said constant magnetic field, performing steps (b)–(g), and processing the resulting electrical signals, said nuclear spectral data set reflecting the spin density of said nuclei in said test object along said first axis; and (k) performance of a correction procedure whereby the values represented in said nuclear spectral data set are adjusted for each point along said first axis by the amounts specified by the corresponding values in said correction data set, thereby correcting said nuclear spectral data set to account for the axial inhomogeneity of said constant magnetic field.

11. A method for producing an image representative of nuclear spin density data, employing nuclear magnetic resonance performed by a species of nuclei in a test object to be sampled, comprising the steps of:

(a) placement of a phantom object containing NMR-observable nuclei in a constant magnetic field oriented in a direction parallel to a first axis;

(b) application of a radiofrequency excitation pulse to excite spins of said nuclei in said phantom object;

(c) application of first, second and third linear magnetic field gradients along mutually orthogonal axes passing through said phantom object, said first gradient being oriented in a direction parallel to said first axis, during which application the spins of said nuclei evolve;

(d) application of a refocusing pulse to produce a spin echo;

(e) detection of said spin echo in the absence of said first, second and third magnetic field gradients;

(f) conversion of said spin echo into a first set of electrical signals;

(g) repetition of steps (b)–(f) wherein the amplitudes of said first, second and third magnetic field gradients are successively varied for each application, thereby producing a multiplicity of sets of electrical signals;

(h) processing of said electrical signals to obtain a correction data set reflecting the deviation of said constant magnetic field from homogeneity in the volume occupied by said phantom object;

(i) storage of said data correction set in the memory of a computer;

(j) storage of a nuclear spectral data set in said computer, said nuclear spectral data set being the result of placing a test object in said constant magnetic field, performing steps (b)–(g), and processing the resulting electrical signals, said nuclear spectral data set reflecting the spin density of said nuclei in said test object in said volume; and (k) performance of a correction procedure whereby the values represented in said nuclear spectral data set are adjusted for each point in said volume by the amounts specified by the corresponding values in said correction data set, thereby correcting said nuclear spectral data set to account for the inhomogeneity of said constant magnetic field.

12. A method of defined in claim 11, wherein said excitation pulse is a nonselective 90° pulse and said refocusing pulse is a nonselective 180° pulse.

13. A method as defined in claim 11, wherein said step of conversion of said spin echos into electrical signals comprises sampling.

14. A method as defined in claim 11, wherein said processing of electrical signals into data comprises four-dimensional Fourier transformation, said data including the three spatial coordinates and the resonance frequency offset, which is directly proportional to the field strength at each point in said volume.

15. A method as defined in claim 14, further comprising the step of imaging said corrected nuclear spectral data in a series of two-dimensional arrays of pixels, wherein the degree of brightness of each pixel represents the nuclear spectral quantity measured at a corresponding point in said volume, and each of said arrays images the data of a corresponding plane lying perpendicular to said first axis, said successive arrays depicting the variation of said data along said first axis.

16. A method for producing an image representative of the strength of a constant magnetic field, employing nuclear magnetic resonance performed by a species of nuclei in a phantom object to be sampled, comprising the steps of:

(a) placement of said phantom object containing NMR-observable nuclei in said constant magnetic field oriented in a direction parallel to a first axis;

(b) application of a radiofrequency excitation pulse to excite spins of said nuclei in said phantom object;

(c) application of first and second linear magnetic field gradients along mutually orthogonal second and third axes lying in a first plane passing through said phantom object, during which application the spins of said nuclei evolve;

(d) application of a refocusing pulse to produce a spin echo;

(e) detection of said spin echo in the absence of said first and second magnetic field gradients;

(f) conversion of said spin echo into a first set of electrical signals;

(g) repetition of steps (b)–(f) wherein the amplitudes of said first and second magnetic field gradients are successively varied for each application, thereby producing a multiplicity of sets of electrical signals;

(h) processing of said electrical signals to obtain a field strength data set reflecting the deviation of said constant magnetic field from homogeneity in said first plane;

(i) storage of said data correction set in the memory of a computer; and (j) imaging said field strength data in a two-dimensional array of pixels, wherein the degree of brightness of each pixel represents the field strength measured at a corresponding point in said first plane.

17. A method for shimming to correct for inhomogeneities in a constant magnetic field, employing nuclear magnetic resonance performed by a species of nuclei in a phantom object to be sampled comprising the steps of:

(a) placement of said phantom object containing NMR-observable nuclei in said constant magnetic field oriented in a direction parallel to a first axis;

(b) application of a radiofrequency excitation pulse to excite spins of said nuclei in said phantom object;

(c) application of first and second linear magnetic field gradients along mutually orthogonal second and third axes lying in a first plane passing through said phantom object, during which application the spins of said nuclei evolve;

(d) application of a refocusing pulse to produce a spin echo;

(e) detection of said spin echo in the absence of said first and second magnetic field gradients;

(f) conversion of said spin echo into a first set of electrical signals;

(g) repetition of steps (b)–(f) wherein the amplitudes of said first and second magnetic field gradients are successively varied for each application, thereby producing a multiplicity of sets of electrical signals;

(h) processing of said electrical signals to obtain a field strength data set reflecting the deviation of said constant magnetic field from homogeneity in said first plane;

(i) storage of said field strength data set in the memory of a computer;

(j) imaging said field strength data in a two-dimensional array of pixels, wherein the degree of brightness of each pixel represents the field strength measured at a corresponding point in said first plane; and (k) performance of shimming of said constant magnetic field, wherin that shim procedure is selected and applied which corrects for the inhomogeneity of said constant magnetic field by rendering the brightness of said pixels more uniform when said shimmed field is imaged.

18. A method for producing an image representative of nuclear spin density data in an object comprising the steps of:

utilizing nuclear magnetic resonance imaging techniques to produce an image of a phantom object, which object has a known nuclear spin density distribution, in a less-than-homogeneous magnetic field;

utilizing the known nuclear spin density distribution of the phantom object to calculate, from the previously obtained image data, the distribution of said less-than-homogeneous magnetic field;

utilizing nuclear magnetic resonance imaging techniques to obtain an image of the nuclear spin density in an object undergoing examination in said less than homogeneous magnetic field; and utilizing said calculated magnetic field distribution to correct errors in the measured nuclear spin density of the test object which arise as a result of inhomogeneities in said less-than-homogeneous magnetic field.

* * * * *